United States Patent
Hirler

(10) Patent No.: US 7,960,285 B2
(45) Date of Patent: Jun. 14, 2011

(54) METHOD FOR THE PRODUCTION OF A COMPONENT STRUCTURE

(75) Inventor: Franz Hirler, Isen (DE)

(73) Assignee: Infineon Technologies AG, Neubiberg (DE)

( * ) Notice: Subject to any disclaimer, the term of this patent is extended or adjusted under 35 U.S.C. 154(b) by 427 days.

(21) Appl. No.: 12/105,852

(22) Filed: Apr. 18, 2008

(65) Prior Publication Data
US 2009/0261455 A1 Oct. 22, 2009

(51) Int. Cl.
*H01L 21/311* (2006.01)
(52) U.S. Cl. .......... 438/700; 438/702; 257/E21.548
(58) Field of Classification Search .......... 438/700, 438/702; 257/E21.548
See application file for complete search history.

(56) References Cited

U.S. PATENT DOCUMENTS

| 6,100,177 | A | * | 8/2000 | Noguchi | 438/620 |
| 6,472,290 | B2 | * | 10/2002 | Cho et al. | 438/411 |
| 6,517,734 | B1 | * | 2/2003 | Muller et al. | 216/24 |

* cited by examiner

*Primary Examiner* — Jarrett J Stark
(74) *Attorney, Agent, or Firm* — Dicke, Billig & Czaja, PLLC

(57) ABSTRACT

A method for the production of a component structure. On embodiment provides a semiconductor body having a first side. A first trench and a second trench are produced, which extend into the semiconductor body proceeding from the first side and are arranged at a distance from one another in a lateral direction of the semiconductor body. A first material layer in the first trench is produced. A third trench proceeding from the second trench is produced, extending as far as the first material layer in the first lateral direction.

9 Claims, 10 Drawing Sheets

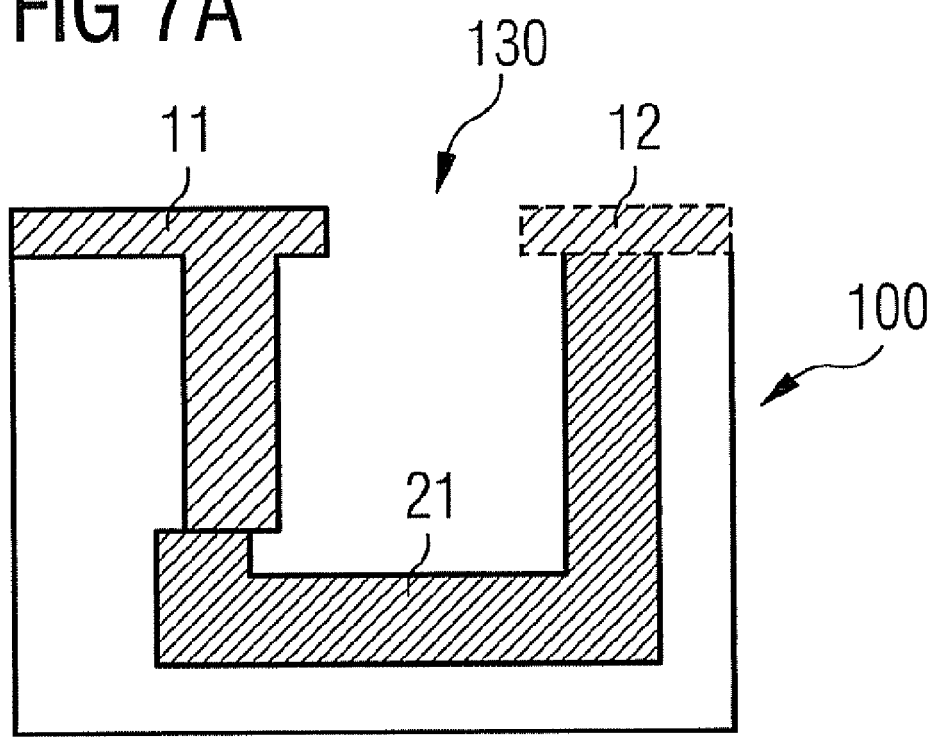
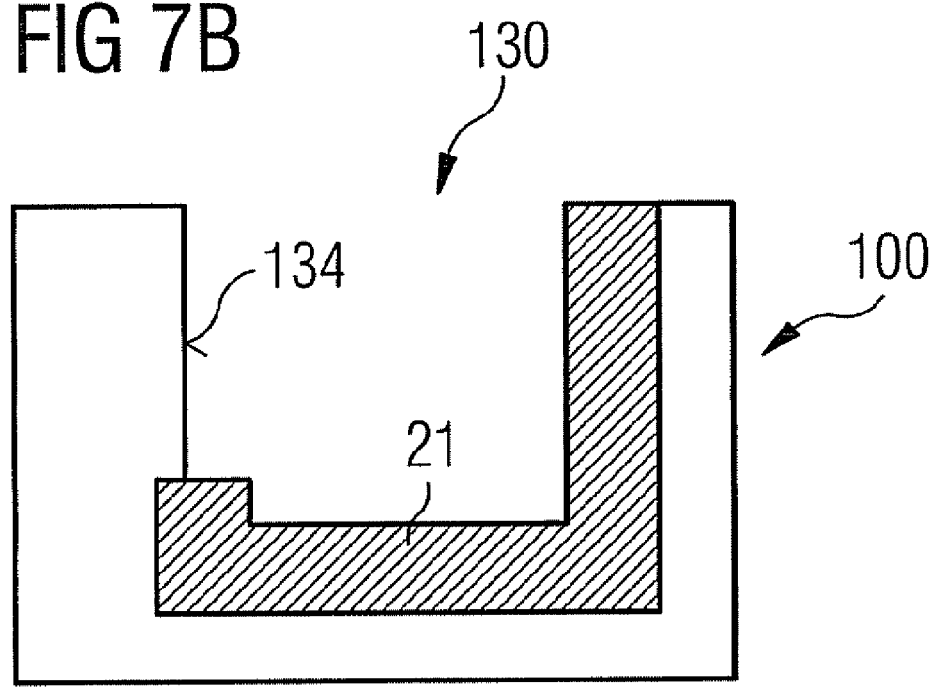

METHOD FOR THE PRODUCTION OF A COMPONENT STRUCTURE

BACKGROUND

The production of semiconductor components in many cases requires the production of a foreign material layer, that is to say a material layer which is not composed of a semiconductor material, in a semiconductor body. Such material layers are for example dielectric layers which are used as a capacitor dielectric in capacitors or which are used as a gate dielectric, field plate dielectric or as a drift control zone dielectric in MOS transistors. Furthermore, such material layers can also be composed of a conductive material such as, for example, a metal or a metal-semiconductor compound.

In a known method for the production of such a foreign material layer, a trench is produced, which extends into the semiconductor body, a material layer is applied to opposite sidewalls of the trench and the material layer is subsequently removed again from one of the two sidewalls, such that a material layer remains only at one of the two sidewalls. The removal of the material layer from one of the two sidewalls is effected by using an etching process, for example. Before the etching process is carried out, in this case a protective layer is applied to that part of the material layer which is not intended to be removed.

The protective layer is for example a photoresist, which is initially applied to both sidewalls but which is subsequently exposed and developed only in the region of one sidewall and the developed and undeveloped regions of which are subsequently etched selectively with respect to one another, such that a protective layer formed by the photoresist remains on one of the two sidewalls. Whether the developed or undeveloped part of the photoresist layer is removed depends on the type of resist (positive or negative) and the etching material used.

Precisely in the production of material layers which are intended to extend deeply into the semiconductor body in a vertical direction of the semiconductor body and in which correspondingly deep trenches are to be produced, the exposure of a photoresist at only one of the sidewalls is difficult, however. In this case, problems can arise as a result of a nonuniform exposure which can result from reflections of the light used at the trench sidewalls.

SUMMARY

One aspect of the present description relates to a method including: providing a body having a first side; producing a first trench and a second trench, which extend into the semiconductor body proceeding from the first side and which are arranged at a distance from one another in a lateral direction of the semiconductor body; producing a first material layer in the first trench; and producing a third trench proceeding from the second trench, which extends as far as the first material layer in the lateral direction.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

FIGS. 7A-B illustrate a fourth example of a method in which further method processes are carried out proceeding from a structure produced by a method in accordance with FIG. 1.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

Figure 1A:
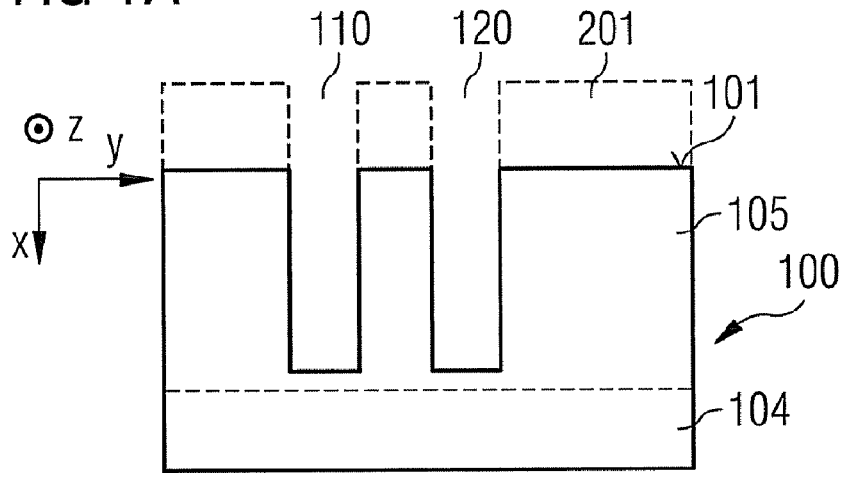
FIGS. 1A-C illustrate an example of a method for the production of a semiconductor device including material layer in a body on the basis of cross sections through the semiconductor body during various method processes.
Figure 1B:
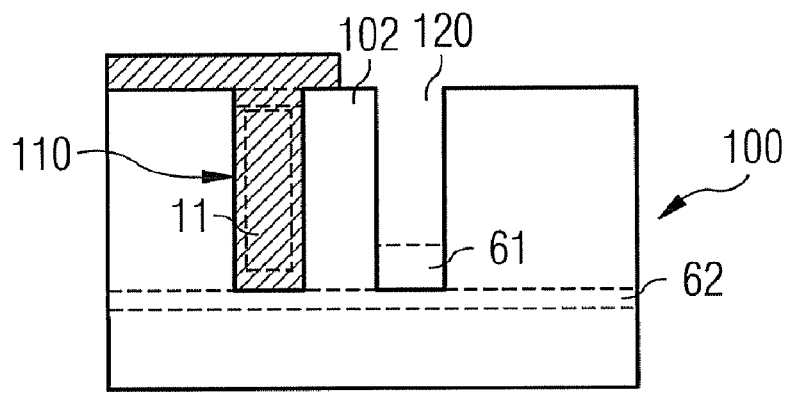
Figure 1C:
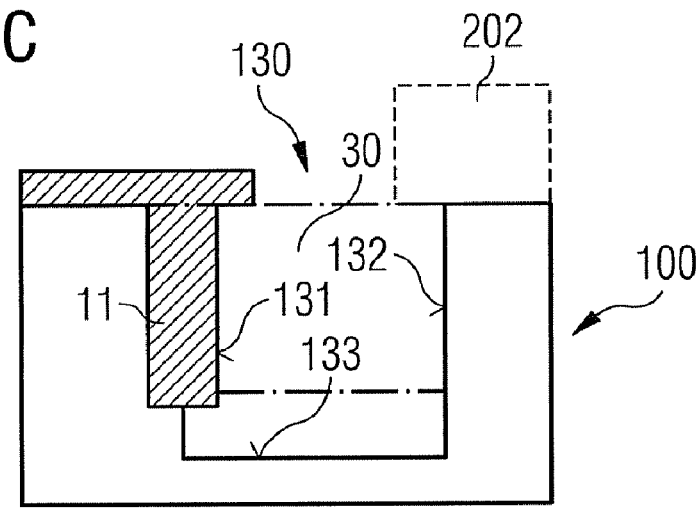

FIGS. 1A to 1C illustrate an example of a method for producing a semiconductor device including a first material layer in a body 100. The body 100 is a semiconductor body, for example, but can also be composed of an electrically conductive material, such as e.g., a metal, or an insulating or dielectric material. Without restricting the general validity of the method explained below, it shall be assumed for explanation purposes that the body 100 is a semiconductor body. This semiconductor body 100 is composed for example of silicon (Si) or silicon carbide (SiC); however, it can be composed of a different semiconductor material.

For elucidating the method, FIGS. 1A to 1C in each case schematically illustrate a cross section through a part of the semiconductor body 100. The semiconductor body 100 has a first side 101; the sectional plane illustrated in the figures is a vertical sectional plane and therefore runs perpendicular to the first side 101.

The semiconductor body 100 has an extent in a vertical direction x. Referring to FIG. 1A, that is the direction running perpendicular to the first side 101. The semiconductor body 100 additionally has an extent in a first lateral direction y and in a second lateral direction z, each running perpendicular to the vertical direction x. In the figures, the first lateral direction y is for example a direction running perpendicular to the vertical direction x in the plane of the drawing. A dimension of the trench in the first lateral direction y is also referred to hereinafter as trench width. In the figures, the second lateral direction z runs for example perpendicular to the plane of the drawing illustrated and perpendicular to the vertical direction x. A dimension of the trench in the second lateral direction z is also referred to hereinafter as trench length. Unless explicitly indicated otherwise in the explanation below, "lateral direction" always denotes the first lateral direction y illustrated in the figures.

Referring to FIG. 1A, the method provides for producing a first trench 110 and a second trench 120, which extend into the semiconductor body 100 proceeding from the first side 101 and which are arranged at a distance from one another in the lateral direction y. The dimensions of the trenches 110, 120 in the second lateral direction z are not explicitly illustrated in the figures. These dimensions correspond, in a manner not illustrated more specifically, to the dimensions in the first lateral direction y or are larger than these dimensions in the first lateral direction, that is to say that the dimensions in the second lateral direction z are a multiple of the dimensions in the first lateral direction. Thus, by way of example, the ratio of a dimension $d_{z\,in}$ the second lateral direction z to a dimension $d_y$, in the first lateral direction y can be greater than 1:1, 10:1 or even greater than 100:1.

In the example illustrated in FIG. 1, the first and second trenches 110, 120 extend into the semiconductor body substantially in a vertical direction x; the trenches 110, 120 therefore run substantially perpendicular to the first side 101. In a manner not illustrated more specifically, however, there is also the possibility of producing the trenches 110, 120 such that the trenches extend into the semiconductor body 100 obliquely, that is to say at an angle of greater than 90°, proceeding from the first side 101; in this case, the trench width decreases with increasing distance from the first side 101. Furthermore, the trenches can also be produced such that the trench walls are at an angle of less than 90° with respect to the first side 101; in this case, the trench width increases with increasing distance from the first side 101 (not illustrated).

The production of the first and second trenches 110, 120 can be effected for example by applying a patterned etching mask 201 to the first side 101 of the semiconductor body 100 and subsequently etching the trenches 110, 120 into the semiconductor body 100 using the etching mask 201. FIG. 1A illustrates the semiconductor body 100 after the production of these first and trenches 110, 120; the etching mask is illustrated by dashed lines in FIG. 1A.

The semiconductor body 100 can be composed of any desired semiconductor material, in one embodiment of silicon (Si) or silicon carbide (SiC). The semiconductor body 100 can be a homogeneously doped semiconductor substrate, but can also include a plurality of differently doped semiconductor regions. Thus, the semiconductor body 100 can have for example a semiconductor substrate 104 and an epitaxial layer 105 applied to the semiconductor substrate 104, as is illustrated in dashed lines in FIG. 1. In this case, the substrate 104 and the epitaxial layer 105 can be doped with dopants of the same conduction type or with complementary dopants and can furthermore have identical or different effective doping concentrations. In the case of such a semiconductor body 100, the trenches 110, 120 can be realized such that they only extend into the epitaxial layer 105, but they can also be realized such that they extend through the epitaxial layer 105 right into the semiconductor substrate 104 (not illustrated).

Referring to FIG. 1B, the method furthermore provides for producing a first material layer 11 in the first trench 110. In the example illustrated, the first material layer 11 completely fills the first trench 110 and additionally also extends over a portion of the first side 101. It goes without saying that there is also the possibility of producing the first material layer 11 such that it only fills the first trench 110, as illustrated by dashed lines in FIG. 1B. In this case, the first material layer 11 can completely fill the first trench 110 (as illustrated by dashed lines), but can also end below the first side 101 in the first trench 110, as illustrated by dash-dotted lines in FIG. 1B.

Furthermore, the first material layer 11 can also be produced such that it only covers sidewalls and a bottom of the first trench 110, with the result that after the production of the first material layer 11, a residual trench remains in the region of the first trench. Such a material layer is illustrated by dotted lines in FIG. 1B. This material layer 11 covering the bottom and the sidewalls can reach in a vertical direction as far as level with the first side 101, but can also end below the first side 101.

Referring to FIG. 1C, after the production of the first material layer 11 in the first trench 110, proceeding from the second trench 120, which is not filled with a material layer, a third trench 130 is produced, which extends in a lateral direction of the semiconductor body 100 as far as the first material layer 11. The third trench 130 has two opposite sidewalls, which are designated by 131 and 132 in FIG. 1C. In this case, a first sidewall 131 is formed at least partly by the first material layer 11, and the second sidewall is formed by a portion of the semiconductor body 100 that is opposite the first sidewall 131.

The production of the third trench 130 proceeding from the second trench 120 is effected by an isotropic etching method, for example, by which, proceeding from the second trench 120, material of the semiconductor body 100 is removed both in a lateral and in a vertical direction. In this case, this etching method is carried out until a semiconductor region 102 (mesa region) between the first material layer 11 and the second trench 120 has been completely removed, such that the third trench 130 reaches in a lateral direction as far as the first material layer 11. In order to carry out the etching method, a mask can be applied to the front side 101 of the semiconductor body, which mask leaves the second trench 120 free but protects the remaining regions of the first side 101. The mask can be a mask applied to the first side 101 separately for this purpose, but can also completely or partly include those portions of the first material layer 11 which are arranged above the first side 101 of the semiconductor body. In the example illustrated in FIG. 1C, a part of the first side 101 is protected by such portions of the first material layer 11, while other regions are protected by an additional mask 202.

In the example illustrated in FIG. 1C, the third trench 130 extends into the semiconductor body 100 more deeply than the first material layer 11 in a vertical direction of the semiconductor body 100 proceeding from the front side 101. However, the third trench 130 can also be produced such that a bottom 133 of the trench lies at the level of a—proceeding from the first side—lower end of the material layer 11, or that the trench extends into the semiconductor body 100 less deeply than the first material layer 11 in a vertical direction proceeding from the first side 101.

When an isotropic etching method is used for the production of the third trench 130, a third trench 130 which extends into the semiconductor body 100 exactly as far as the first and second trenches 110, 120 or not as far as the first and second trenches 110, 120 can be produced by the bottom of the second trench 120 being covered with a further material layer, for example an oxide, a photoresist, carbon or the like, up to a predetermined level. An etching attack by the etchant used for the etch then begins, in a vertical direction, at the level of an upper edge of the material layer and not at the level of the bottom of the trench. Such a further material layer 61 produced in the second trench 120 is illustrated by dashed lines in the figure. The bottom of a third trench 130 produced using such a further material layer 61 is likewise illustrated by dashed lines in FIG. 1C.

The material layer 61 at the bottom of the second trench 120 can be produced for example by trench 120 firstly being filled completely with a material desired for the layer 61, and by this filling subsequently being removed to the predetermined level, for example by etching. In one embodiment, the semiconductor body 100 can have a buried layer, such as an oxide layer for example. In this case, the buried layer can serve as a stop layer during the etching of the first to third trenches 110, 120 and 130. The position of the buried layer within the semiconductor body 100 in this case limits the dimensions of the trenches 110, 120, 130 in a vertical direction. Such an optionally present buried layer 62 is already present in the semiconductor body 100 at the beginning of the method, but is illustrated by dashed lines only in FIG. 1B, for reasons of clarity. Such a buried layer is present for example when the semiconductor body 100 is an SOI substrate. Such a SOI substrate includes two semiconductor layers and an insulation layer, such as e.g., an oxide, arranged between the semiconductor layers.

It should be pointed out in this connection that the first mask 201, which is used for the production of the first and second trenches 110, 120, need not necessarily be removed after the production of the trenches, rather that the first material layer 11 can be produced in the first trench 110 while the first mask 201 is still applied to the first side 101. In this case, the first mask can be used for the isotropic etching method for the production of the third trench 130 after the first material layer 11 has been produced in the first trench.

The third trench 130 can subsequently be filled with a filling material 30, as illustrated by dash-dotted lines in FIG. 1C. The filling material can be a semiconductor material, for example, which is deposited epitaxially in the third trench 130. However, the filling material can be a dielectric material, for example an oxide, or a conductive material, such as e.g., a metal, a metal-semiconductor compound, or a doped or undoped amorphous or polycrystalline semiconductor material.

Instead of filling the third trench 130 directly after the production of the first material layer 11, proceeding from the structure illustrated in FIG. 1C, it is also possible, however, to carry out even further method processes for the production of a component structure. Examples of such method processes will be explained below. In this case, the first material layer 11 can either remain in the semiconductor body 100 and thus form a part of the later component structure. However, the first material layer 11 can also constitute an auxiliary layer in the further method processes, which is finally removed.

Figure 2A:
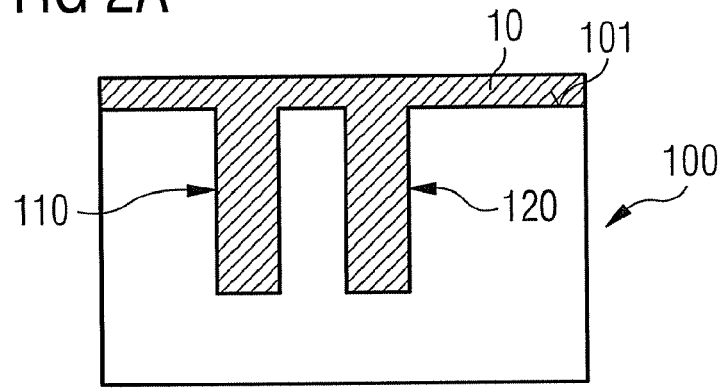
FIGS. 2A-C illustrate an example of a method for the production of a structure illustrated in FIG. 1B.
Figure 2B:
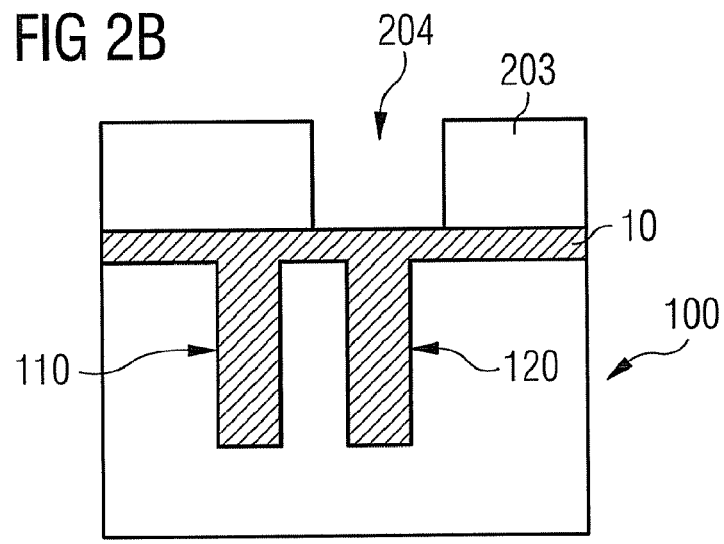
Figure 2C:
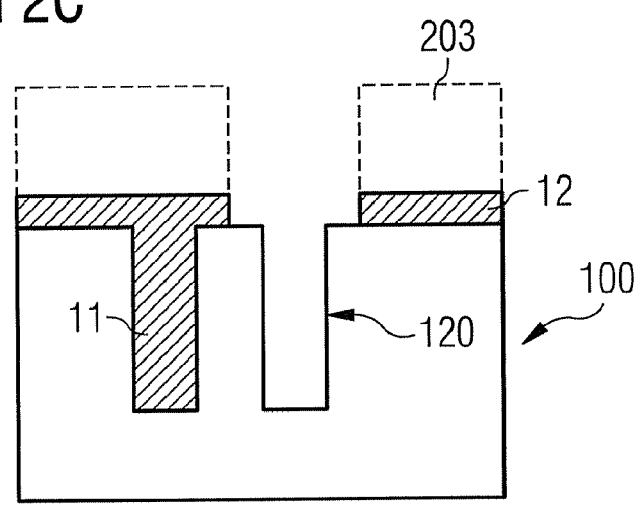

FIGS. 2A to 2C illustrate a possible method for the production of the first material layer 11 in the first trench 110. Referring to FIG. 2A, this method involves firstly depositing a material layer 10 onto the first side 101 of the semiconductor body 100 in such a way that the first and second trenches 110, 120 are filled. In this case, the material layer 10 fills the first and second trenches 110, 120 and furthermore covers uncovered regions of the first side 101 of the semiconductor body 100. Referring to FIG. 2B, a mask 203 is subsequently produced on the previously applied material layer 10, the mask having a cutout 204 in the region of the second trench 220. The material layer 10 is subsequently removed—for example by using an etching method—from the second trench 120, the result of which is illustrated in FIG. 2C. The method processes explained result in a structure in which the material layer 10 remains in the first trench 110 and forms the first material layer 11 in the trench, while the material layer 10 is removed from the second trench 120.

The mask 203 used in a method in accordance with FIGS. 2A to 2C can serve as a mask when carrying out the isotropic etching method explained with reference to FIG. 1C. It should be noted in this connection that the masks 201, 202, 203 explained above can be hard masks, for example, in one embodiment oxide hard masks, or resist masks.

The first material layer 11 produced in the first trench 110 on the basis of the method processes explained above can be composed of any desired foreign material, that is to say of any desired material which differs from the material of the semiconductor body. Thus, the material layer can be for example an oxide, in one embodiment a semiconductor oxide, a nitride, in one embodiment a semiconductor nitride, a metal or a metal-semiconductor compound, for example a silicide. However, the material layer 11 can also be composed of a semiconductor material which differs from the material of the semiconductor body 100 with regard to its material or else only with regard to its crystal state (monocrystalline, amorphous, polycrystalline) or its doping. An oxide layer is produced for example by deposition of an oxide layer or by thermal oxidation of the semiconductor body 100 in the region of uncovered surfaces. A nitride layer is produced by deposition, for example. A metal-semiconductor compound is produced for example by filling the first trench 110 with a metal and by subsequently carrying out a thermal treatment, as a result of which the metal reacts with the semiconductor material surrounding the trench to form a metal-semiconductor compound. In a manner that will be explained below, the material layer 11 can also include a layer system having a plurality of layers which are applied successively at least to sidewalls and the bottom of the first trench 110. In this case, it suffices for that layer of the layer system which is applied directly to the semiconductor body 100 to differ from the material of the semiconductor body 100. Such a layer system can completely fill the first trench 110, but can also be produced in such a way that it only covers the bottom and sidewalls of the trench, whereby a residual trench remains.

Figure 3A:
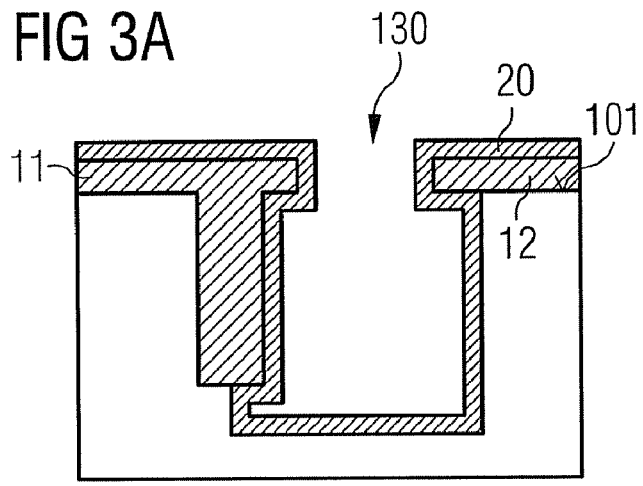
FIG. 3A-B illustrate a first example of a method in which further method processes are carried out proceeding from a structure produced by a method in accordance with FIG. 1.
Figure 3B:
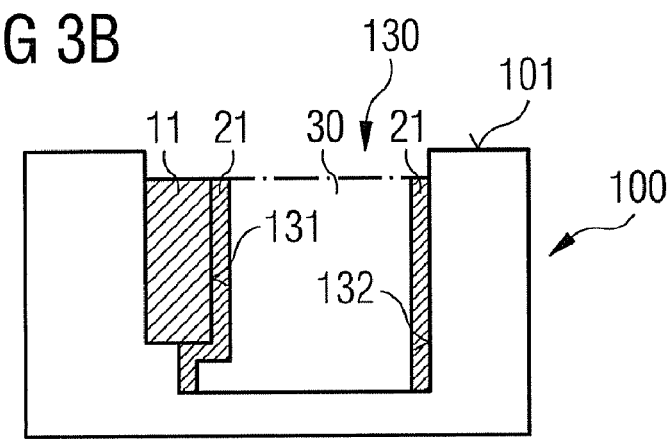

FIGS. 3A and 3B illustrate a method in which further method processes are carried out proceeding from the component structure obtained by the method in accordance with FIG. 1. In this method, referring to FIG. 3B, a second material layer 21 is produced at the opposite sidewalls 131, 132 of the third trench 130. The second material layer 21 can be composed of the same material as the first material layer 11, but can also be composed of a different material than the material of the first material layer 11. Thus, the first material layer 11 can be composed of an oxide, for example, and the second material layer 21 can be composed of a nitride, for example. Conversely, the first material layer 11 can also be composed of a nitride and the second material layer 21 of an oxide.

Referring to FIG. 3A, the production of the second material layer 21 at the sidewalls 131, 132 of the third trench 130 can be effected for example by firstly depositing a material layer 20 composed of the material of the later second material layer over the whole area, that is to say on the sidewalls 131, 132 and the bottom 133 of the trench 130 and above the first side 101 of the semiconductor body. By way of example, a CVD method (CVD=chemical vapor deposition) or a plasma method is suitable as the method for depositing the further material layer. The further material layer 20 is subsequently removed from horizontal areas, for example by anisotropic etching. The further material layer 20 is thereby removed above the first side 101 of the semiconductor body and from the bottom 131 of the third trench 130, but remains on the first sidewall 131, that is to say on the first material layer 11, and on the second sidewall 132.

In the structure illustrated in FIG. 3A, the first material layer extends in sections over the front side 101 of the semiconductor body. Furthermore, a third material layer 12, which is composed for example of the same material as the first material layer 11, is applied on the front side 101 in a region that is adjacent to the third trench 130 at a side of the trench 130 opposite to the first material layer 11. Such a structure arises for example when, proceeding from the structure illustrated in FIG. 2C, an isotropic etching method is carried out for the production of the third trench 130, in which method those sections of the material layer 10 which remained on the first side 101 serve as a mask for the isotropic etching. It goes without saying that carrying out the method explained with references to FIGS. 3A and 3B is not exclusively applicable to such a structure in which such a material layer 12 is present. It goes without saying that this method can also be applied to the structure which is illustrated in FIG. 1C and in which (after the removal of the mask 202) the first side 101 of the semiconductor body 100 is uncovered in sections.

Referring to FIG. 3B, the sections of the first material layer 11 which are arranged on the first side 101, and if appropriate the second material layer 12, can likewise be etched back anisotropically after the anisotropic etching back of the further material layer 20, which results in the structure illustrated in FIG. 3B. The part of the trench 130 that remains after the production of the second material layer 21 can be filled with a filling material, as is illustrated by dash-dotted lines in FIG. 3B. The filling material can be for example a semiconductor material which is deposited selectively epitaxially in the trench 130. However, the filling material can also be composed of an electrically conductive material, such as e.g., a metal, an electrically insulating material, a dielectric material or an amorphous or polycrystalline semiconductor material.

In this case, the trench can be filled with the filling material after the further material layer 20 has been removed from the bottom of the trench, but actually before the second material layer 12 is removed from the first side 101. In this case, the second material layer 12 protects the first side 101 from application of the material with which the trench 130 is filled. Thus, for example when filling the trench 130 by using a selective epitaxy method, this prevents semiconductor material from growing on the first side 101. The second material layer 12—and if appropriate the filling material applied to the second material layer 12—can be removed after the trench 130 has been filled.

The result of the method explained with reference to FIGS. 3A and 3B is a semiconductor structure in which two material layers are arranged in a semiconductor body 100, the material layers being arranged at a distance from one another in a lateral direction of the semiconductor body. The two material layers, one of which is formed by the first material layer 11 and a section of the second material layer 21 that is applied to the first sidewall 131, and the other of which is formed by the section of the second material layer 21 that is applied to the second sidewall 132, have different thicknesses, that is to say have different dimensions in a lateral direction.

In a departure from the explanation above, in the method explained with reference to FIGS. 3A and 3B, there is also the possibility of completely leaving the material layer 20 after the deposition thereof, that is to say not etching it back anisotropically above the first side 101 and at the bottom 133, though the result of this is not illustrated.

Figure 4:
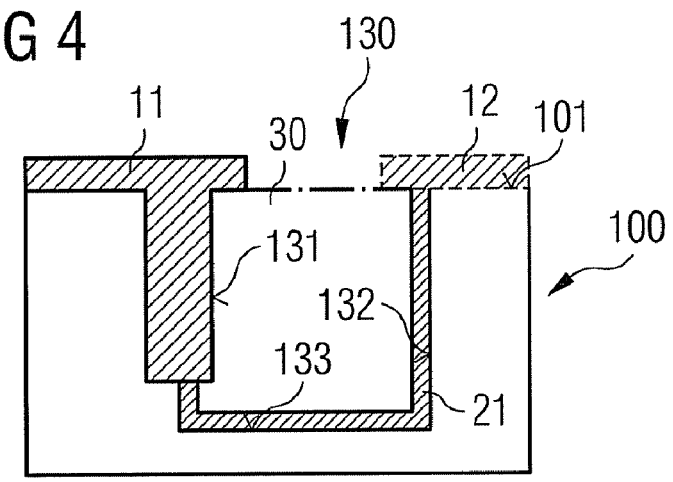
FIG. 4 illustrates a second example of a method in which further method processes are carried out proceeding from a structure produced by a method in accordance with FIG. 1.

FIG. 4 illustrates a semiconductor structure which can be obtained, proceeding from the structure illustrated in FIG. 1C, after carrying out further method processes. A third material layer 12, which is illustrated in FIG. 4 and which is arranged on sections of the first side 101 of the semiconductor body, is optionally present, to be precise depending on how the structure in accordance with FIG. 1C is produced. This optional third material layer 12 is therefore illustrated by dashed lines in FIG. 4. In the case of the semiconductor structure illustrated in FIG. 4, the second material layer 21 extends over the second sidewall 132 and the bottom 133 of the third trench 130. In the case of the semiconductor structure illustrated, the third trench 130 extends into the semiconductor body more deeply in a vertical direction than the first material layer 11. In this case, the second material layer 21 has a section which extends in a vertical direction of the semiconductor body as far as the bottom 133 of the third trench 130 proceeding from the first material layer 11. If the trench 130 is produced in such a way that it extends in a vertical direction at most as far as the lower end of the first material layer 11 (not illustrated), the additional section of the second material layer 21 is obviated. In this case, the second material layer 21 extends only over the second sidewall 132 and the bottom 133 of the trench.

The second material layer 21 can be composed of the same material as the first material layer 11, for example an oxide, a nitride, a metal or a metal-semiconductor compound, but can also be composed of a different material than the material of the first material layer 11.

The second material layer 21 is for example an oxide layer produced by thermal oxidation of those regions of the semiconductor body 100 which are uncovered in the third trench 130. In this case, the first material layer 11 is composed for example of a nitride or likewise of an oxide.

The third trench 130 can be filled with a filling material 30 after the production of the second material layer 21. The filling material is for example a semiconductor material or an electrically conductive material, such as, for example, a metal, or a highly doped amorphous or polycrystalline semiconductor material, in one embodiment polysilicon.

Figure 5A:
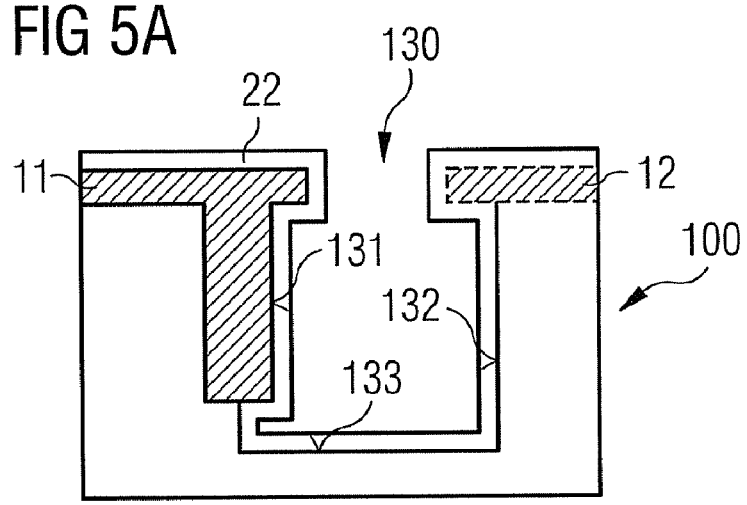
FIGS. 5A-C illustrate a third example of a method in which further method processes are carried out proceeding from a structure produced by a method in accordance with FIG. 1.
Figure 5B:
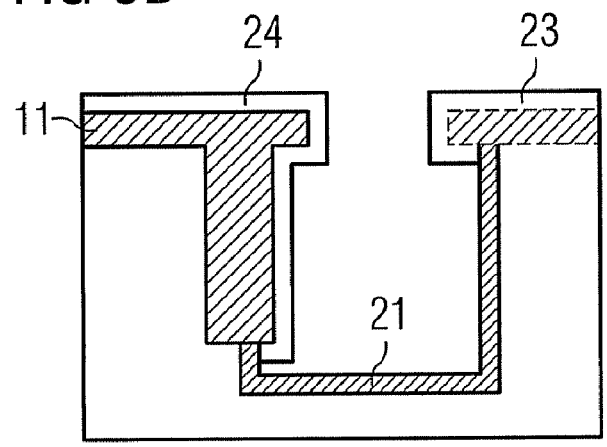

One example of the structure explained above with reference to FIG. 4 provides for producing the second material layer 21 from a metal-semiconductor compound. Referring to FIG. 5A, this method provides for depositing a metal layer 22 over the whole area, that is to say both on the two opposite sidewalls 131, 132 of the third trench 130 and at the bottom 133 of the trench 130. Referring to FIG. 5B, a thermal process is subsequently carried out, as a result of which the material layer 22, in those regions of the third trench 130 in which it was applied to previously uncovered regions of the semiconductor body, reacts with material of the semiconductor body 100 to form a metal-semiconductor compound, whereby the second material layer 21 arises. If the semiconductor body 100 is composed of silicon, for example, then the metal-semiconductor compound is a silicide. Suitable metals for producing such a silicide are for example tungsten (W), titanium (Ti), tantalum (Ta), cobalt (Co), molybdenum (Mo) or copper (Cu).

In FIG. 5B, the reference symbol 24 denotes residues of the original material layer 22 which have not reacted with the material of the semiconductor body 100. The residues 24 are parts of the original material layer 22 that were applied on the first material layer 11. The residues 24 are subsequently removed, for example by using an etching process which etches the residues 24 of the material layer 22 selectively with respect to the material of the second material layer 21. The result of this further method process is the semiconductor structure which is illustrated in FIG. 5C and which corresponds to the semiconductor structure illustrated in FIG. 4.

Figure 5C:
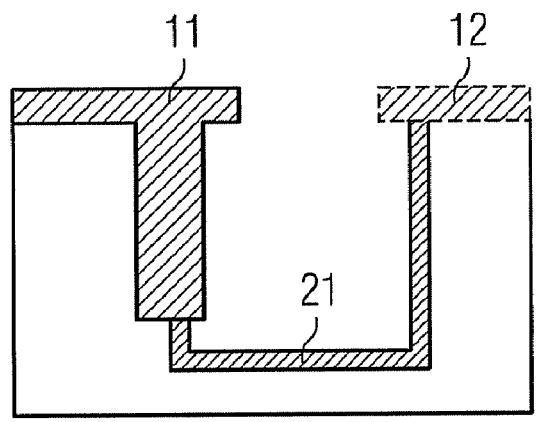
Figure 6A:
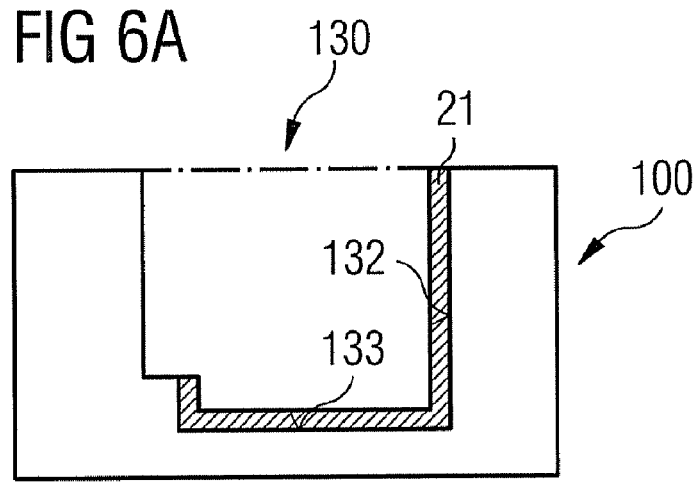
FIGS. 6A-C illustrate a method in which further method processes are carried out proceeding from structures illustrated in FIG. 4 or FIG. 5C.
Figure 6B:
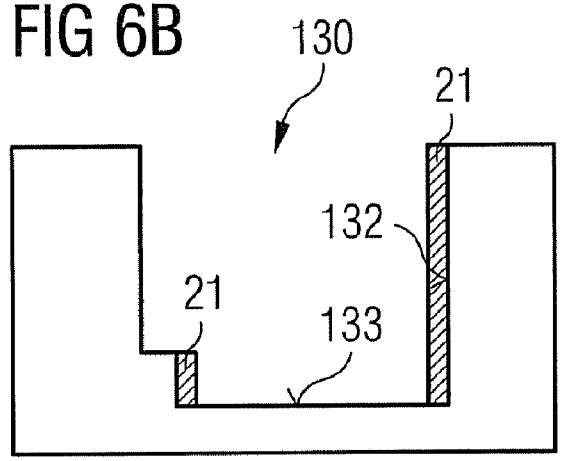
Figure 6C:
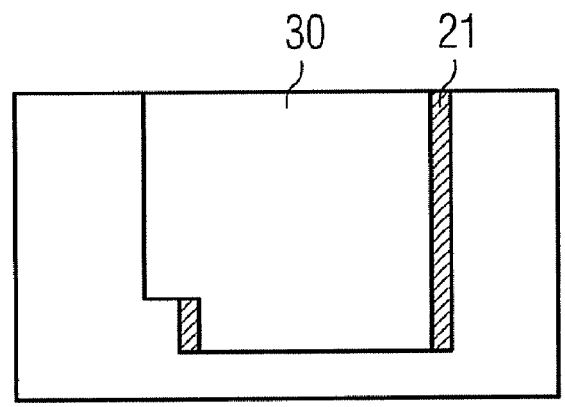

FIGS. 6a to 6C illustrate a method in which further method processes are carried out proceeding from a structure in accordance with FIGS. 4 and 5C, that is to say in which the third trench 130 is not filled directly after the production of the second material layer 21. In this method, the first material layer 11 is removed after the production of the second material layer 21. In this case, the first material layer 11 is composed for example of a different material than the second material layer 21. In order to remove the first material layer 11, an etching method is used, for example, which etches the first material layer 11 selectively with respect to the second material layer 21 and the semiconductor body 100. For this purpose, the first material layer 11 is composed of an oxide, for example, while the second material layer 21 is composed for example of a nitride, carbon, or a metal-semiconductor compound. Furthermore, there is also the possibility of the first material layer 11 being composed of a nitride, while the second material layer 21 is composed of an oxide, carbon or a metal-semiconductor compound. Furthermore, the first and/or second material layer can also be layer systems having two or more layers composed of the materials mentioned. In addition to the materials mentioned, such layer systems can also include further materials, such as e.g., a doped or undoped amorphous or polycrystalline semiconductor material, in one embodiment polysilicon.

The (enlarged) third trench 130 after the removal of the first material layer 11 can be filled by a filling material 30, for example a semiconductor material, that is illustrated by dash-dotted lines in FIG. 6A. For this purpose, by using a selective epitaxy method, for example, semiconductor material can be deposited in monocrystalline fashion proceeding from the sidewall not covered by the second material layer 21. Semiconductor material deposited on the first side 101 in this case can be removed by etching or a polishing method, such as e.g., a CMP method (CMP=chemical mechanical polishing).

Optionally, referring to FIG. 6B, there is also the possibility of removing the second material layer 21 from the bottom 133 of the third trench 130 after the removal of the first material layer 11, for example by using an anisotropic etching method. The result of these method processes is a second material layer 21 applied to the second sidewall 132 of the third trench 130. The third trench 130 can subsequently be filled with a filling material 30, the result of which is illustrated in FIG. 6C. The filling material is for example a semiconductor material which is deposited epitaxially in the third trench 130.

If, in the method in accordance with FIG. 6, the third trench 130 has been produced such that it extends into the semiconductor body 100 further in a vertical direction than the first material layer 11 removed later, after carrying out the anisotropic etching method illustrated with reference to FIG. 6B, a small section of the second material layer 21 remains below the region in which the first material layer 11 was previously present. The section is all the smaller, the lesser the extent to which the third trench 130 extends below the first material layer 11.

The result of the method processes explained with reference to FIGS. 6B and 6C is a second material layer 21 which extends into the semiconductor body 100 in a vertical direction. The dimensioning of the second material layer 21 in a lateral direction, that is to say the thickness of the second material layer 21, is essentially determined by the production conditions or deposition conditions under which the second material layer was applied to the second sidewall 132 of the trench 130.

FIG. 7A illustrates a semiconductor structure after carrying out method processes in which, proceeding from the semiconductor structure illustrated in FIG. 1C, a first material layer 21 was produced by thermal oxidation of the semiconductor body at the second sidewall 132 and at the bottom 133 of the third trench 130. In this method, the first material layer 11 and the optionally present third material layer 12 are composed for example of a nitride or a layer system including nitride and protect remaining regions of the semiconductor body 100 from the thermal oxidation.

Referring to FIG. 7B, the first material layer 11 can be removed after the production of the second material layer 21. FIG. 7B illustrates the semiconductor structure after the removal of the material layer 11. In order to remove the first material layer 11, an etching method is used, for example, which etches the first material layer 11 selectively with respect to the second material layer 21.

Figure 8A:
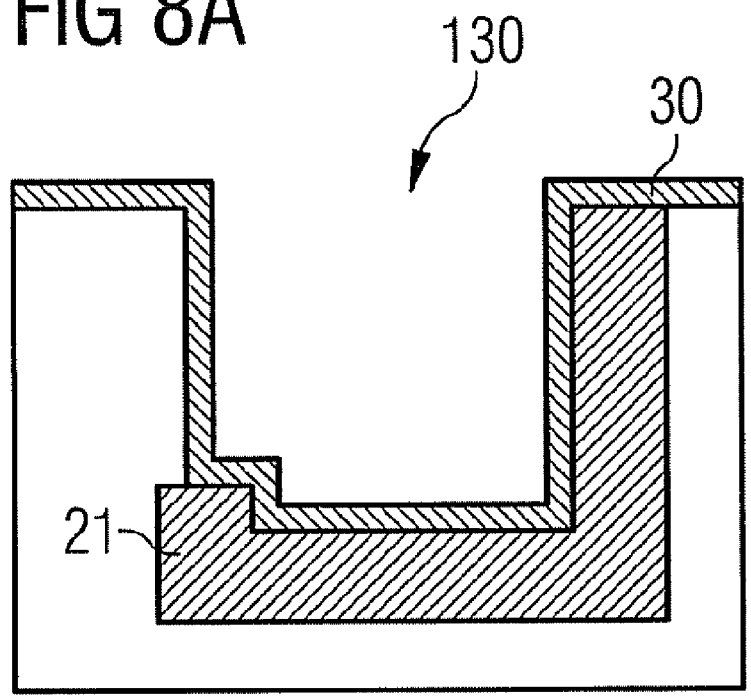
FIGS. 8A-B illustrate the structure obtained by the method in accordance with FIG. 7 after further method processes have been carried out.
Figure 8B:
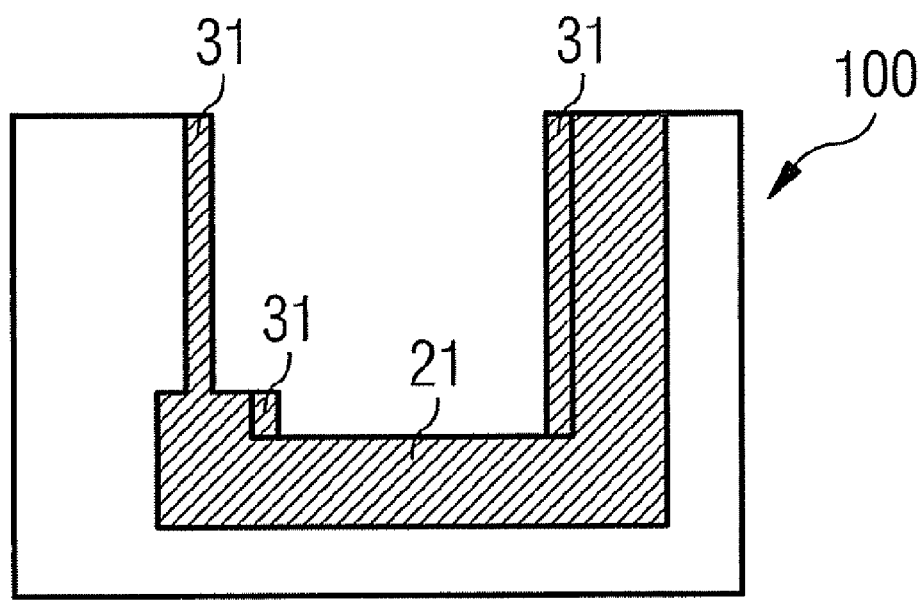

Further method processes can be carried out proceeding from the semiconductor structure explained with reference to FIG. 7B. Referring to FIG. 8B, there is the possibility, for example, of producing a fourth material layer 31 on those regions of the semiconductor body 100 which are uncovered after the removal of the first material layer in the region of the third trench 130. In this case, the fourth material layer 31 can be composed of the same material as the second material layer 21, that is to say an oxide, but can also be composed of a different material than the material. Referring to FIG. 8A, the fourth material layer 31 is produced for example by whole-area deposition of a material layer 30 and subsequent anisotropic etching back of the material layer, in which case, after the anisotropic etching back, the material layer 30 remains only at sidewalls of the semiconductor structure, that is to say at the sidewall 134 of the semiconductor body 100 that is uncovered after the removal of the first material layer 11, and on the second material layer 21 in the region opposite the sidewall 134. In one embodiment, the fourth material layer 31 can also be produced by oxidation.

By using the method explained with reference to FIGS. 8A and 8B, a semiconductor structure is obtained in which a trench of a semiconductor body contains an oxide layer having different thicknesses, namely a thinner first oxide layer on the sidewall 134 that is uncovered after the removal of the first material layer 11, and a thicker oxide layer in remaining regions, that is to say the bottom and an opposite sidewall. If the oxide layer 30 explained with reference to 8A is etched back anisotropically, that section of the oxide layer which is applied to the bottom 133 and that section of the oxide layer which is opposite the sidewall 134 may differ with regard to their thickness. In this case, the difference in thickness corresponds to the thickness of the fourth layer 31 produced on the sidewall 134.

A semiconductor structure such as is illustrated in FIG. 8B is suitable for example for the production of a lateral MOS transistor. Such a MOS transistor is illustrated in cross section in FIG. 9. In this case, the third trench 130 is filled with an electrically conductive filling material 30, for example a metal or a highly doped polycrystalline semiconductor material, such as polysilicon for example. The filling material 30 forms a gate electrode of the MOS transistor. The fourth material layer 31, which is thinner than the second material layer 21, forms a gate dielectric in this transistor. A body zone 43 of a first conduction type and a source zone 44 of a second conduction type are arranged adjacent to the gate dielectric 31 in the semiconductor body 100. Moreover, a drift zone 41 of the first conduction type is adjacent to the gate dielectric 31 in sections. In this case, the body zone 43 is arranged between the source zone 44 and the drift zone 41. In this component, the gate electrode 30 serves for controlling a conductive channel in the body zone 43 between the source zone 44 and the drift zone 41. The drift zone 41 extends in the semiconductor body 100 adjacent to the second material layer 21 around the third trench 130 as far as a drain zone 45. In the example illustrated, the drain zone 45 is adjacent to the second material layer 21 and in the case of a MOS transistor formed as a MOSFET, is of the same conduction type as the drift zone 41 and, in the case of a MOS transistor formed as an IGBT, is doped complementarily to the drift zone 41. In the component illustrated, the source zone 44 and the drain zone 45 are arranged in the region of the first side 101 of the semiconductor body 100 and at the opposite sides of the third trench 130 are adjacent to the fourth material layer 31, which forms the gate dielectric, and the second material layer 21. In this case, the drain zone 45 can also be arranged at a distance from the trench; in other words, the drain zone 45 does not have to be adjacent to the trench or the second material layer 21. The second material layer 21, which is thicker than the fourth material layer 31, dielectrically insulates the gate electrode 30 from further sections of the drift zone 41. The gate electrode 30 acts as a field plate with respect to these sections of the drift zone 41, and the second material layer 21 correspondingly acts as a field plate dielectric.

Contact is made with the source zone 44 by using a source electrode 51, which is arranged above the first side 101 and, in the example illustrated, makes contact both with the source zone 44 and with the body zone 43. Contact is made with the drain zone 45 by using a drain electrode 52. An insulation layer 53 insulates the gate electrode 30 from the source electrode 51 and the drain electrode 52.

Figure 9:
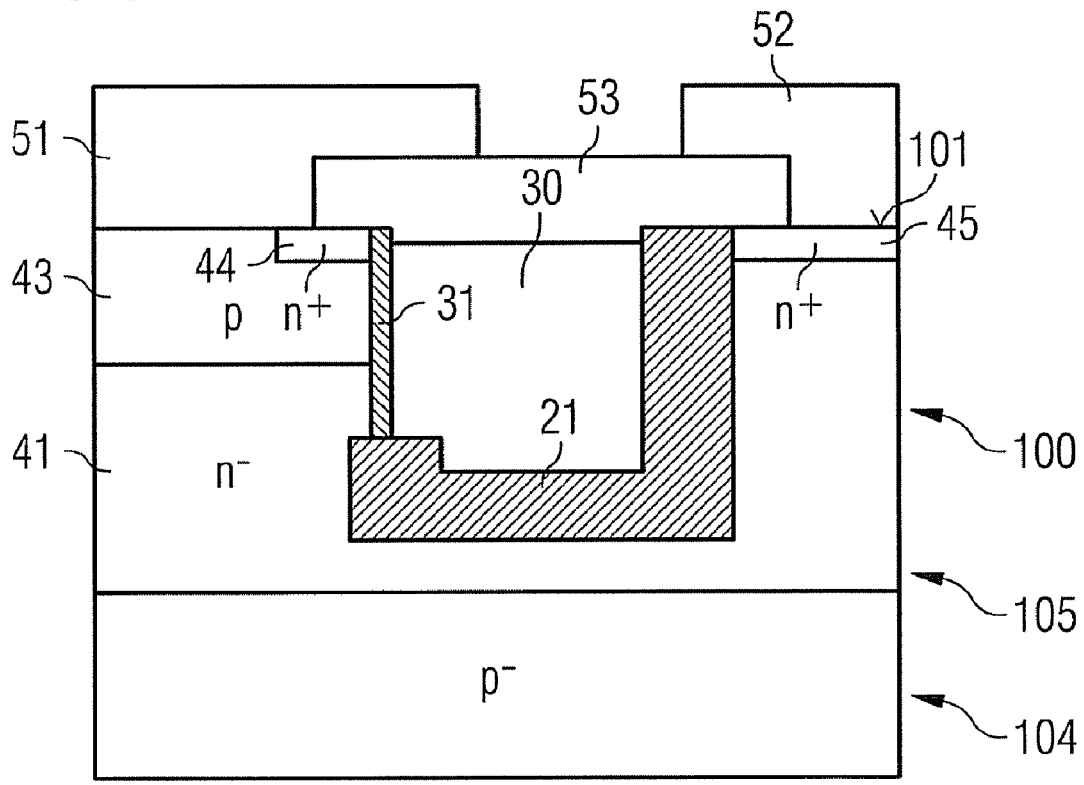
FIG. 9 illustrates a MOS transistor having a structure in accordance with FIG. 8.

In the MOS transistor illustrated in FIG. 9, the drift zone 41 is for example part of an epitaxial layer 105 applied to a semiconductor substrate 104, which is doped complementarily to the drift zone 41. In this component, the body zone 43, the source zone 44 and the drain zone 45 are produced for example by implantation or indiffusion of dopant atoms into the epitaxial layer 105. These component zones are produced for example only after the production of the gate dielectric 31 and of the field plate dielectric 21 and after the production of the gate electrode 30.

Figure 10:
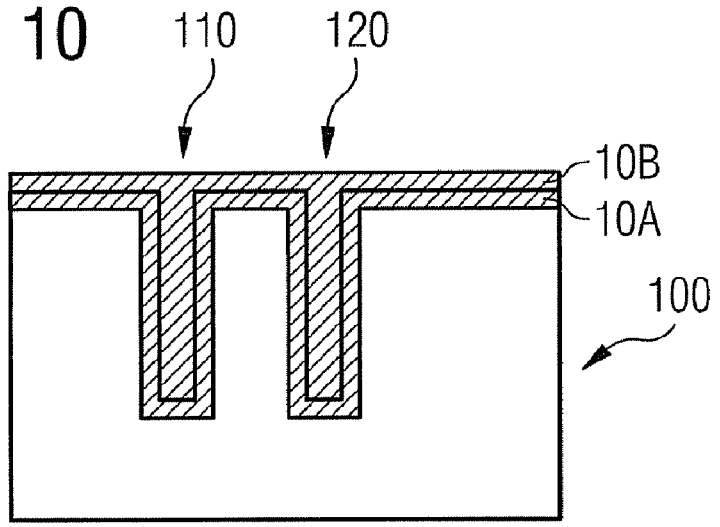
FIG. 10 illustrates a method process of a further method for the production of a material layer in a semiconductor body.

In the method processes explained above, it was assumed for explanation purposes that the first material layer 11, which is illustrated in the first trench, is a homogeneous material layer. In a departure from this explanation, there is also the possibility, of course, of realizing this material layer in such a way that it is constructed in a sandwich-like manner and therefore includes a plurality of partial layers. Referring to FIG. 10, such a first material layer including a plurality of partial layers can be produced for example by a plurality of layers being deposited successively after the production of the first and second trenches 110, 120. The layer structure thus obtained can subsequently be patterned, for example using the method explained with reference to FIG. 2, in such a way that a sandwich-like layer structure forming the first material layer remains only in the first trench 110.

Referring to FIG. 11, in a departure from the examples explained above, there is also the possibility of producing the two trenches 110, 120 in such a way that they have different dimensions in the lateral direction. Thus, by way of example, the first trench 110 can have smaller dimensions than the second trench 120 in the lateral direction, as illustrated in FIG. 11A.

Figure 11A:
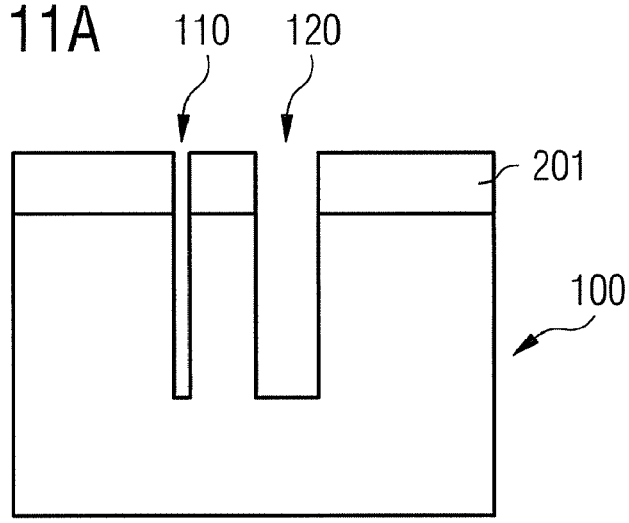
FIGS. 11A-E illustrate a further method for the production of a material layer in a semiconductor body.
Figure 11B:
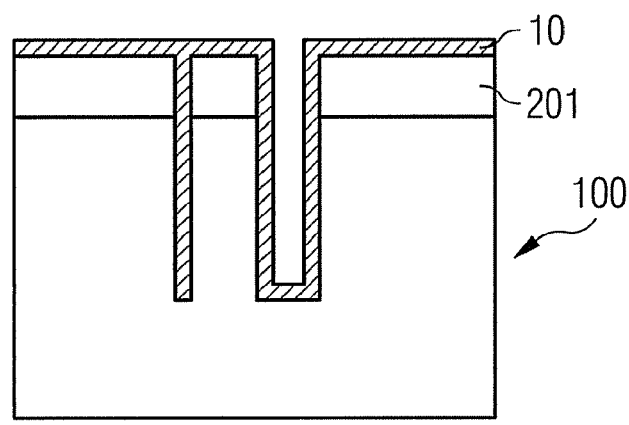

Referring to FIG. 11B, a material layer 10 is subsequently produced in such a way that it completely fills the first trench 110, but only covers the sidewalls and the bottom in the second trench, such that after the production of the material layer 10, a residual trench remains in the region of the second trench 120. In this case, the trench widths of the first and second trenches 110, 120 and also a layer thickness of the material layer 10—which can also be a layer system—are coordinated with one another in such a way that the layer thickness is greater than half the trench width of the first trench 110 but less than half the trench width of the second trench. The mask 201 used for producing the first and second trenches 110, 120 can remain on the first side 101 during the production of the material layer 10.

Figure 11C:
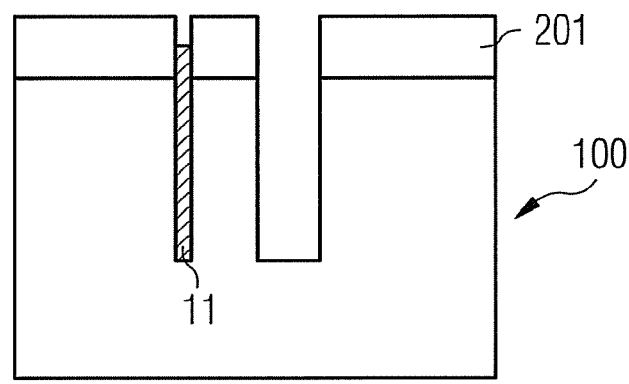

The material layer 10 is subsequently removed from the second trench 120, but remains in the first trench 110 and forms the first material layer 11 there, the result of which is illustrated in FIG. 11C. By way of example, an isotropic etching method is suitable for removing the material layer 10 from the first trench. An etchant used for this purpose can attack the material layer 10 in the second trench 120 over the whole area, such that the material layer 10 is completely removed from the second trench 120. In the region of the first trench 110, by contrast, the material layer 110 is only etched back slightly relative to the surface of the mask layer 201.

Figure 11D:
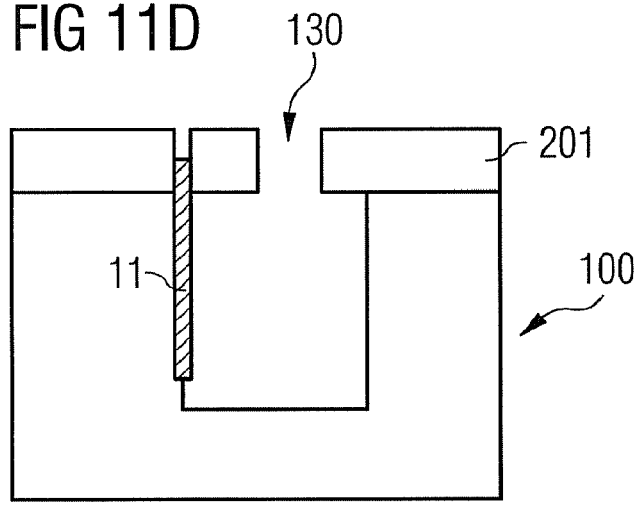
Figure 11E:
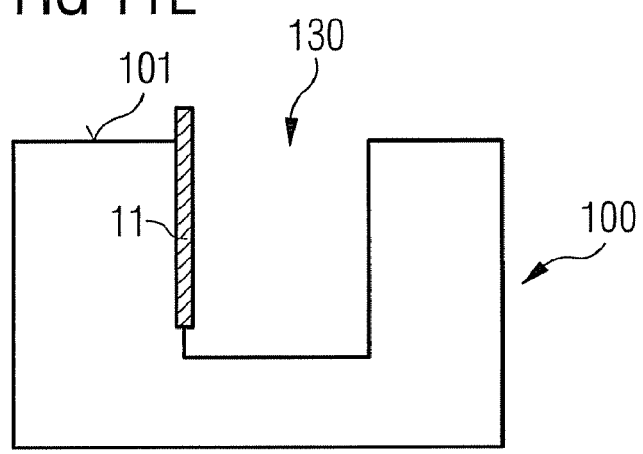

Referring to FIG. 11D, the third trench 130 is subsequently produced, which reaches as far as the first material layer 11 in a lateral direction. A method already explained with reference to FIG. 1, such as e.g., an isotropic etching method, is suitable for this purpose. The mask 201 already used as a mask during the production of the first and second trenches 110, 120 can be used as a mask for this etching method. The mask 201 is subsequently removed, the result of which is illustrated in FIG. 11E.

The method for the production of the first material layer 11 as explained with reference to FIGS. 11B and 11C has the advantage over the method explained with reference to FIGS. 2A to 2C that it is not necessary to produce a mask which corresponds to the mask 203 (in FIG. 2B) and which protects the material layer 10 in the first trench 110 if the material of the material layer 10 is removed from the second trench 120.

Figure 12:
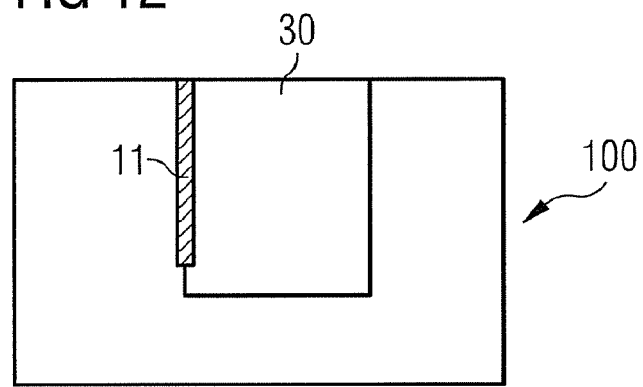
FIG. 12 illustrates the structure obtained by the method in accordance with FIG. 11 after further method processes have been carried out.

The result of the method processes explained with reference to FIGS. 11A to 11E is a first material layer 11 applied only at one sidewall of a trench 103. A section of the first material layer 11 that possibly projects beyond a first side 101 of the semiconductor body 100 can subsequently be removed, and the trench 130 can be filled with any desired filling material 30, the result of which is illustrated in FIG. 12. The filling material can be, in one embodiment, a semiconductor material produced by a selective epitaxy method, but can also be an electrically conductive material, such as e.g., a metal, an insulating material or a dielectric material.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method, comprising:
providing a body having a first side;
producing a first trench and a second trench, which extend into the semiconductor body proceeding from the first side and which are arranged at a distance from one another in a lateral direction of the semiconductor body;
producing a first material layer in the first trench;
producing a third trench proceeding from the second trench, which extends as far as the first material layer in the first lateral direction;
wherein the third trench has a first sidewall, which is formed by the first material layer, and a second sidewall, which lies opposite the first sidewall; and
producing a second material layer in the third trench at least at the second sidewall, wherein producing the second material layer furthermore comprises:
applying a material layer composed of a material of the first material layer to the sidewalls and a bottom of the third trench, and
removing the material layer from the bottom of the third trench and/or removing the material layer from the first sidewall.

2. A method, comprising:
providing a body having a first side;
producing a first trench and a second trench, which extend into the semiconductor body proceeding from the first side and which are arranged at a distance from one another in a lateral direction of the semiconductor body;
producing a first material layer in the first trench; and
producing a third trench proceeding from the second trench, which extends as far as the first material layer in the first lateral direction, by an isotropic etching method which, proceeding from the second trench, removes material of the semiconductor body and which in a lateral direction completely removes the material between the first and second trench;
wherein the third trench has a first sidewall, which is formed by the first material layer, and a second sidewall, which lies opposite the first sidewall, and wherein the method furthermore comprises:
producing a second material layer in the third trench at least at the second sidewall, and composing the first and second material layers of an identical material.

3. A method, comprising:
providing a body having a first side;
producing a first trench and a second trench, which extend into the semiconductor body proceeding from the first side and which are arranged at a distance from one another in a lateral direction of the semiconductor body;
producing a first material layer in the first trench;
producing a third trench proceeding from the second trench, which extends as far as the first material layer in the first lateral direction;
wherein the third trench has a first sidewall, which is formed by the first material layer, and a second sidewall, which lies opposite the first sidewall; and
producing a second material layer in the third trench at least at the second sidewall, wherein producing the second material layer furthermore comprises:
applying an auxiliary material layer to the sidewalls and a bottom of the third trench; and
performing a chemical reaction by using which the auxiliary material layer in the third trench at least at the second sidewall reacts with a material of the body and forms the second material layer there.

4. The method of claim 3, comprising wherein the auxiliary material layer in the third trench reacts with the material of the body at the second sidewall and at the bottom of the third trench, and wherein a resultant compound layer is removed from the bottom of the third trench in such a way that the compound layer remains at the second sidewall and forms the second material layer there.

5. The method of claim 3, comprising composing the auxiliary material layer of a metal.

6. A method, comprising:
providing a body having a first side;
producing a first trench and a second trench, which extend into the semiconductor body proceeding from the first side and which are arranged at a distance from one another in a lateral direction of the semiconductor body;
producing a first material layer in the first trench; and
producing a third trench proceeding from the second trench, which extends as far as the first material layer in the first lateral direction, by an isotropic etching method which, proceeding from the second trench, removes material of the semiconductor body and which in a lateral direction completely removes the material between the first and second trench;
wherein the third trench has a first sidewall, which is formed by the first material layer, and a second sidewall, which lies opposite the first sidewall, and wherein the method furthermore comprises:
producing a second material layer in the third trench at least at the second sidewall;
composing the first and second material layers of different materials;
removing the first material layer after producing the second material layer;
producing the second material layer in the region of the bottom and the second sidewall of the third trench; and
producing the second material layer by thermal oxidation of the body at areas uncovered in the region of the third trench.

7. A method, comprising:
providing a body having a first side;
producing a first trench and a second trench, which extend into the semiconductor body proceeding from the first side and which are arranged at a distance from one another in a lateral direction of the semiconductor body;
producing a first material layer in the first trench; and
producing a third trench proceeding from the second trench, which extends as far as the first material layer in the first lateral direction, by an isotropic etching method which, proceeding from the second trench, removes material of the semiconductor body and which in a lateral direction completely removes the material between the first and second trench;
wherein the third trench has a first sidewall, which is formed by the first material layer, and a second sidewall, which lies opposite the first sidewall, and wherein the method furthermore comprises:
producing a second material layer in the third trench at least at the second sidewall;
composing the first and second material layers of different materials;
removing the first material layer after producing the second material layer; and producing a third material layer at a sidewall of the third trench that is uncovered after removing the first material layer.

8. The method of claim 7, comprising composing the second and third material layers of the same material.

9. The method of claim 7, comprising filling the third trench with a filling material after producing the third material layer.

* * * * *